US006435893B1

(12) United States Patent
Kasahara

(10) Patent No.: US 6,435,893 B1
(45) Date of Patent: Aug. 20, 2002

(54) SOCKET FOR PIN GRID ARRAY PACKAGE

(75) Inventor: Katsunori Kasahara, Fuchu (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/612,995

(22) Filed: Jul. 10, 2000

(30) Foreign Application Priority Data

Jul. 9, 1999 (JP) .......................................... 11-196384

(51) Int. Cl.[7] .............................................. H01R 4/50
(52) U.S. Cl. .................................................... 439/342
(58) Field of Search ................................. 439/263, 264, 439/268, 342, 259

(56) References Cited

U.S. PATENT DOCUMENTS

| | | | |
|---|---|---|---|
| 4,815,987 A | | 3/1989 | Kawano et al. ............. 439/263 |
| 5,454,727 A | * | 10/1995 | Hsu ............................ 439/263 |
| 5,562,474 A | * | 10/1996 | Lee ............................ 439/342 |
| 5,752,846 A | | 5/1998 | Abe ............................ 439/266 |
| 5,855,489 A | * | 1/1999 | Walker ....................... 439/342 |
| 5,967,824 A | * | 10/1999 | Neal et al. .................. 439/342 |
| 6,083,028 A | * | 7/2000 | Pei et al. .................... 439/342 |

OTHER PUBLICATIONS

European Patent Office Search Report, dated Aug. 8, 2001.

* cited by examiner

Primary Examiner—Brian Sircus
Assistant Examiner—Thanh-Tam Le
(74) Attorney, Agent, or Firm—Robert J. Zeitler

(57) ABSTRACT

A socket is provided for a pin grid array (PGA) package having a plurality of lead pins in a grid array. The socket includes a base housing and a plurality of terminals mounted on the base housing in a grid array corresponding to the array of the lead pins of the PGA package. A slide plate is mounted on the base housing and includes a plurality of through-holes arranged in a grid array for receiving therethrough the lead pins of the PGA package. The slide plate is slidably movable relative to the base housing in a given direction to drive the lead pins of the PGA package into engagement with the terminals on the base housing. A slide actuator is mounted on the base housing for sliding movement relative thereto in a direction generally transversely of said given direction of sliding movement of the slide plate. A cam mechanism is provided between the slide plate and the slide actuator for slidably moving the slide plate relative to the base housing in response to sliding movement of the actuator relative to the housing.

15 Claims, 6 Drawing Sheets

SOCKET FOR PIN GRID ARRAY PACKAGE

FIELD OF THE INVENTION

This invention generally relates to a socket for a pin grid array package and, particularly, to an improved actuating mechanism for the socket.

BACKGROUND OF THE INVENTION

Sockets are provided for a pin grid array (PGA) package such as a semi-conductor integrated circuit package in which lead pins are provided in a grid array. A typical socket includes a planar base housing provided with a plurality of terminals which can be electrically engaged with the lead pins of the PGA package. A planar slide member or plate is disposed on an upper side of the base housing and is provided with a plurality of through-holes in a grid array and through which the lead pins can be inserted. In some instances, a cover member may be provided on top of the slide plate, and through-holes also are provided in the cover member. Examples of such sockets are shown in Japanese Patent Laid-Open Publication No. Hei 7-142134 and Japanese Utility Model Registration No. 253644.

The slide plate for the socket described above allows the lead pins to be inserted into the socket with a zero insertion force when the slide plate is in a first or open position. After the lead pins are inserted through the slide plate, the plate is slidably moved relative to the base housing to a second or engagement position whereat the lead pins are brought into electrical connection with the terminals mounted on the base housing. Typically, some form of actuating mechanism is provided, operatively associated between the base housing and the slide plate, for moving the slide plate between its first and second positions.

One type of actuating mechanism according to the prior art is an eccentric shaft which is basically in the form of a screw member which is operated by an appropriate tool, such as a screwdriver. The screw member is axially fixed to the base housing but is rotatable relative thereto. The screw member has an eccentric portion engageable with the slide plate. Therefore, upon rotation of the screw member, the eccentric portion thereof moves the slide plate relative to the base housing between its first or open position and its second or engagement position. Although this type of actuating mechanism has proven quite effective, it creates a problem in requiring an operator to have a tool in order to use the socket.

Another type of actuating mechanism according to the prior art is a lever or operating handle rotatably mounted to the base housing. Like the rotatable screw member, the lever or handle has an eccentric or cam shaft for engaging the slide plate and moving the slide plate relative to the base housing. Again, such lever-type operating mechanisms have proven effective for their intended purposes, but they create problems in that they may be difficult to grasp, prone to breakage and require considerable vertical space for operation.

The present invention is directed to solving these problems by providing a low profile actuating mechanism which is simple to operate and requires no tools.

SUMMARY OF THE INVENTION

An object, therefore, of the invention is to provide a new and improved socket for a pin grid array (PGA) package having a plurality of lead pins in a grid array.

Another object of the invention is to provide an improved operating or actuating mechanism for such sockets.

In the exemplary embodiment of the invention, the socket includes a base housing and a plurality of terminals mounted on the base housing in a grid array corresponding to the grid array of the lead pins of the PGA package. A slide plate is mounted on the base housing and includes a plurality of through-holes arranged in a grid array for receiving therethrough the lead pins of the PGA package. The slide plate is slidably movable relative to the base housing in a given direction to drive the lead pins of the PGA package into engagement with the terminals on the base housing. A slide actuator is mounted on the base housing for sliding movement relative thereto in a direction generally transversely of the given direction of sliding movement of the slide plate. Complementary interengaging cam structure is provided between the slide plate and the slide actuator for slidably moving the slide plate relative to the base housing in response to sliding movement of the actuator relative to the housing.

As disclosed herein, the complementary interengaging cam structure includes a cam slot on one of the slide plate or slide actuator for receiving a cam follower on the other of the slide plate or slide actuator. The cam slot extends oblique to the given direction of sliding movement of the slide plate. In the preferred embodiment, the cam slot is on the slide actuator and the cam follower comprises a pin on the slide plate inserted into the cam slot. It also is contemplated that the cam slot includes a land area at least at one end thereof and extending generally perpendicular to the given direction of sliding movement of the slide plate. This land area prevents the cam follower from migrating along the cam slot once the slide plate is in its intended position. Preferably, one of the land areas is provided at both opposite ends of the cam slot.

Another feature of the invention is the provision of complementary interengaging detent structure between the slide actuator and the base housing to hold the actuator in at least one of its open or closed positions. Preferably, the detent structure is provided for holding the actuator in either of its open or closed positions. The detent structure also provides a tactile and audible indication of the actuator reaching either of its positions.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
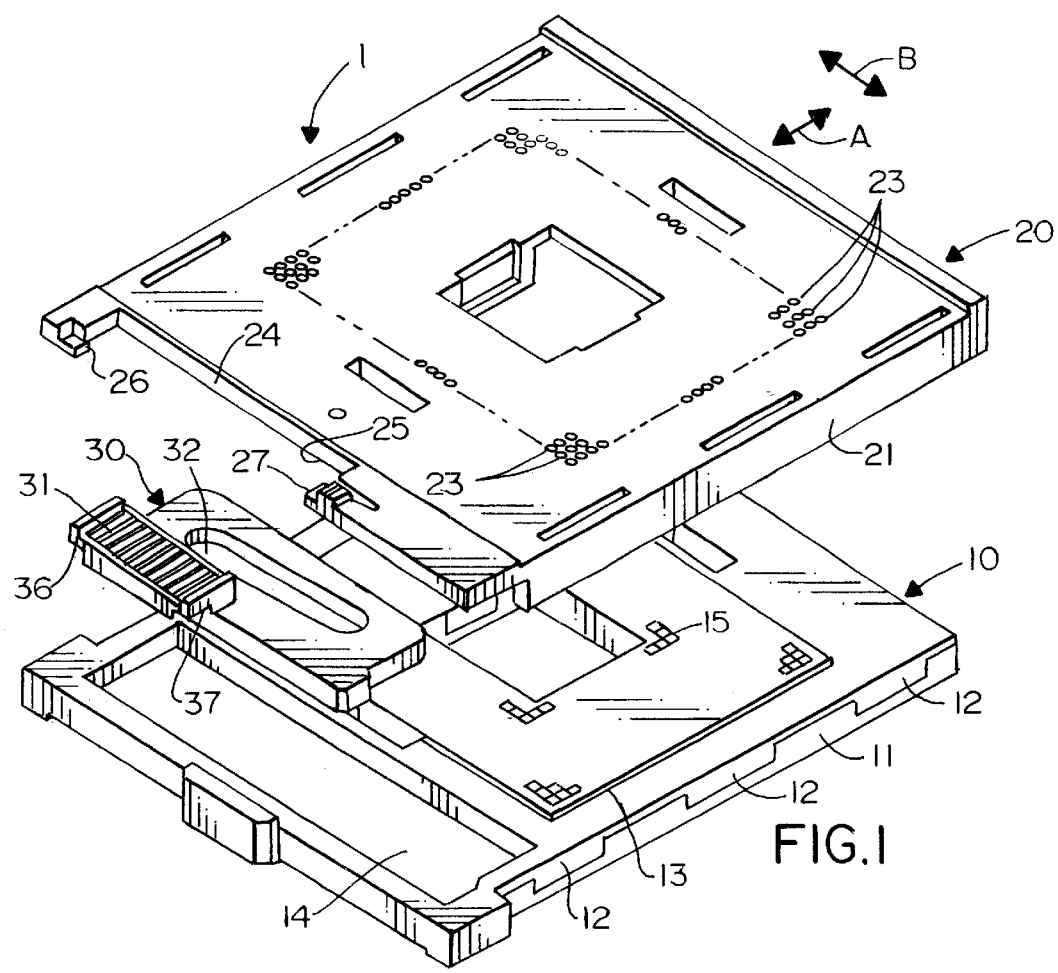
FIG. 1 is an exploded perspective view of a socket for a pin grid array (PGA) package according to the invention.

Referring to the drawings in greater detail, and first to FIG. 1, the invention is embodied in a socket, generally designated 1, for a pin grid array (PGA) package having a plurality of lead pins in a grid array, as described hereinafter. The socket includes three major components, all of which are molded of dielectric material such as plastic or the like, and a plurality of conductive terminals. Specifically, the three major components include a base housing, generally designated 10; a slide plate, generally designated 20; and a slide actuator, generally designated 30. Slide plate 20 is slidably mounted on base housing 10 for movement relative thereto in the direction of double-headed arrow "A." Slide actuator 30 is slidably mounted on the base housing for sliding movement relative thereto generally in the direction of double-headed arrow "B." Sliding movement of slide actuator 30, therefore, is generally transversely of the sliding movement of slide plate 20.

More particularly, base housing 10 is generally rectangular and is thin or low profile and includes opposite sides 11 having a plurality of latch projections 12. The housing includes a first recessed area 13 and a second recessed area 14. The first recessed area includes a plurality of terminal-receiving passages 15 in a grid array corresponding to the grid array of the lead pins of the PGA package. Second recessed area 14 slidably receives slide actuator 30 to define its movement in the direction of double-headed arrow "B."

Figure 5:
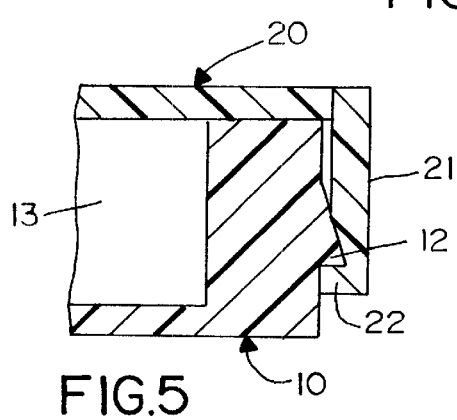
FIG. 5 is an enlarged, fragmented section taken generally along line 5—5 in FIG. 3.

Slide plate 20 of socket 1 also has a low profile and is rectangular like base housing 10. The side plate has side walls 21 which overlap sides 11 of the base housing and include inwardly directed latch projections 22 (see FIG. 5) for latchingly engaging latch projections 12 at sides 11 of base housing 10. Latch projections 11 and 22 on the base housing and slide plate, respectively, are elongated in the direction of double-headed arrow "A" to allow the slide plate to reciprocally move in that direction, while side walls 21 of the slide plate prevent the plate from moving transversely of that direction.

Still referring to FIG. 1, slide plate 20 further includes a plurality of through holes 23 arranged in a grid array generally corresponding to the grid array of terminal-receiving passages 15 in the base housing and corresponding to the grid array of the lead pins of the PGA package. The slide plate includes a recessed area 24 that extends substantially the entire width of base housing 10 along one edge thereof for accommodating an actuating button of slide actuator 30, as described hereinafter. A cam follower pin 25 projects downwardly from the slide plate adjacent the recessed area, and a pair of upwardly facing detent projections 26 and 27 are formed at opposite ends of the recessed area, all for purposes to be described hereinafter.

Slide actuator 30 of socket 1 is molded generally in the form of a rectangular platelike member which seats in recessed area 14 of base housing 10 for reciprocal movement therewithin in the direction of double-headed arrow "B." The slide actuator is about one half the length of recessed area 24 in order to permit substantial movement of the actuator within recessed area 24. An actuating button 31 extends from the slide actuator, and the top surface of the button is serrated or undulated to facilitate engagement thereof by an operator's finger. The button also includes raised end sections 31 a that extend upwardly from slide actuator 30 provide additional; surfaces that can be enjoyed by the operators finger. The slide actuator has an elongated cam slot 32 for receiving cam follower pin 25 of slide plate 20. A pair of downwardly facing detent projections 36 and 37 are formed on the underside of actuating button 31 for engaging upwardly facing flexible detent projections 26 and 27, respectively, at opposite ends of recess area 24 of slide plate 20.

Figure 2:
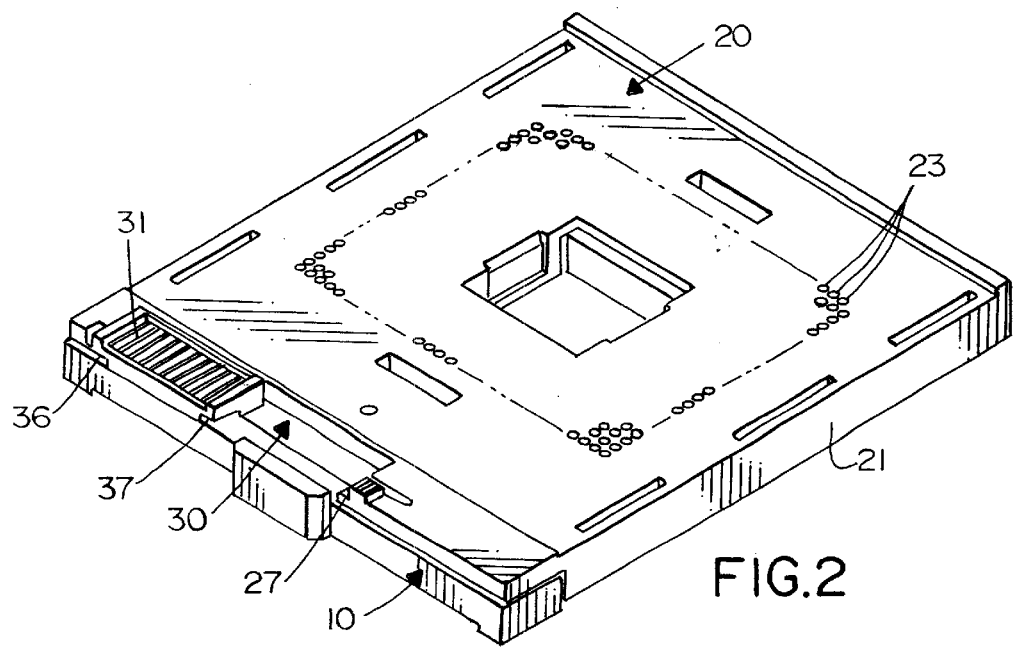
FIG. 2 is a perspective view of the socket assembled and in its open position.
Figure 3:
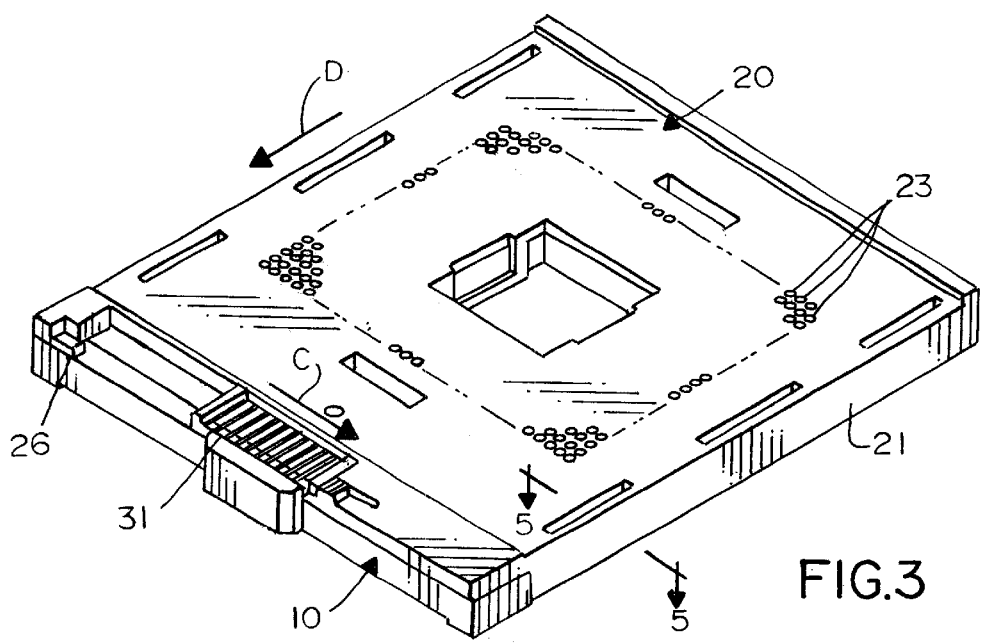
FIG. 3 is a view similar to that of FIG. 2, with the socket in its closed or engagement position.

FIG. 2 shows slide actuator 30 and actuating button 31 in its open position, with slide plate 20 in a position for receiving the lead pins of the PGA package with zero insertion force. FIG. 2 shows actuating button 31 having moved the slide actuator in the direction of arrow "C" which is effective to move slide plate 20 in the direction of arrow "D" to its engagement position. When the slide actuator is in the open position of FIG. 2, downwardly facing flexible detent projection 36 of the slide actuator interengages with upwardly facing flexible detent projection 26 on slide plate 20. When the slide actuator is in its engagement position of FIG. 3, downwardly facing detent projection 37 interengages with upwardly facing detent projection 27 of the slide plate. The detent projections hold the slide actuator in its two limit positions. The detent projections are rounded and provide both a tactical as well as an audible or "snapping" indication that the slide actuator has reached either of its two limit positions.

Figure 4:
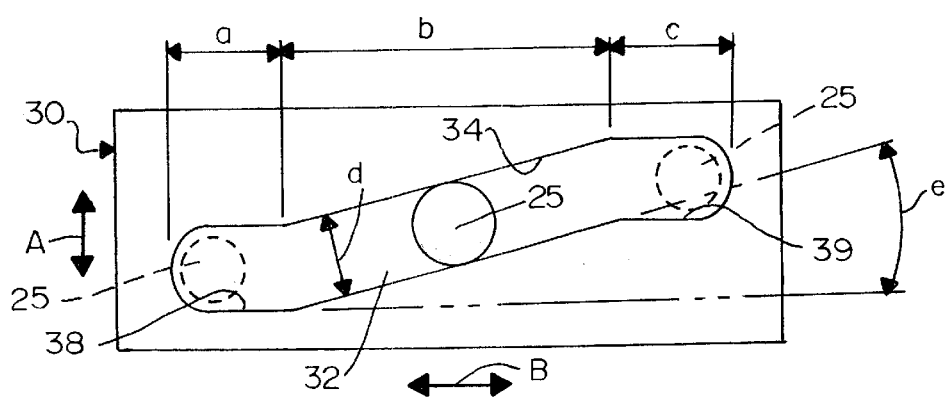
FIG. 4 is a somewhat schematic illustration of the cam slot and follower mechanism between the slide actuator and the slide plate.

FIG. 4 shows somewhat schematically the configuration of slide actuator 30, but shows cam slot 32 in considerable detail. The cam slot has an elongated or oblique portion 34 indicated by double-headed arrow "b" and which terminates at its ends in generally flat land areas 38 and 39 indicated by double-headed arrows "a" and "c." The entire cam slot has a constant width dimension "d" for freely accommodating cam follower pin 25 depending from the underside of slide plate 20 as described above in relation to FIG. 1. It can be seen in FIG. 4 that oblique portion 34 of cam slot 32 extends at an angle "e" to the direction "B" of reciprocating movement of slide actuator 30. On the other hand, land portions 38 and 39 at the ends of the cam slot are generally parallel to the direction of reciprocal movement of the slide actuator. These flat lands, thereby, prevent cam follower pin 25 from migrating away from the end positions within the slot which define the open and engagement positions of slide plate 20. In essence, when slide actuator 30 moves in the direction of double-headed arrow "B", the sides of oblique portion 34 of cam slot 32 engage cam follower pin 25 and drive slide plate 20 in the direction of double-headed arrow "A" (FIG. 1 and 4).

Figure 6:
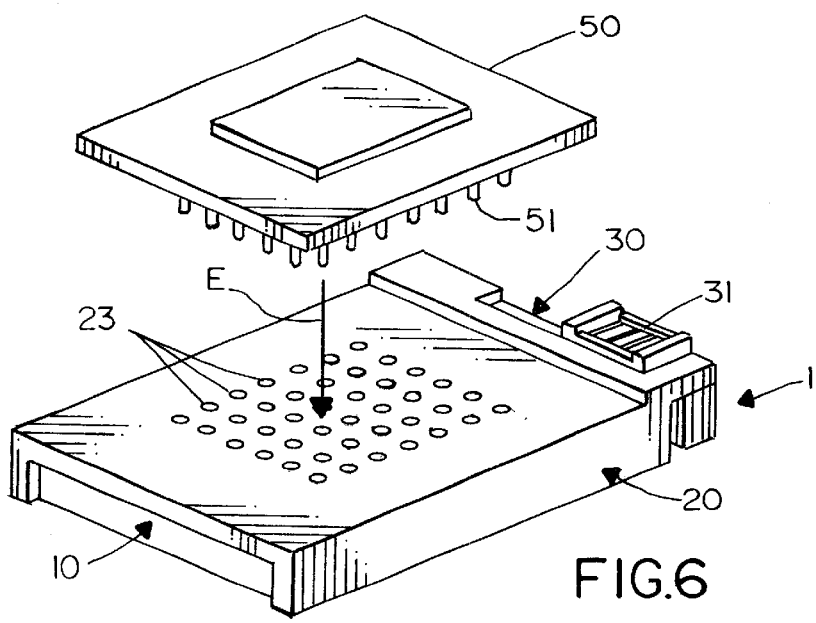
FIG. 6 is a perspective view, on a reduced scale, showing a PGA package about to be mounted on the socket.
Figure 7:
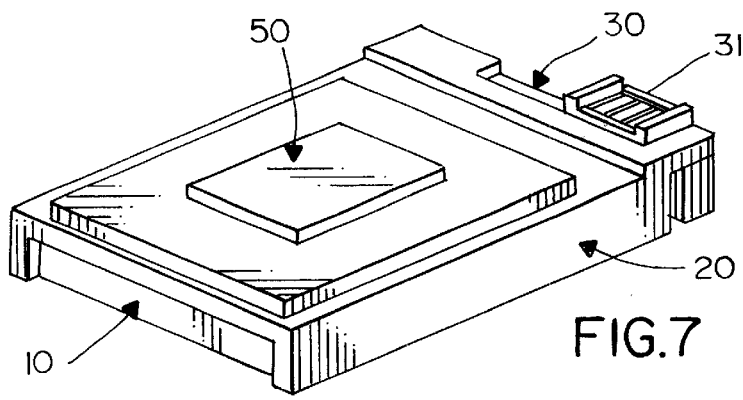
FIG. 7 is a view similar to that of FIG. 6, with the PGA package mounted on the socket and with the socket in its open condition.
Figure 8:
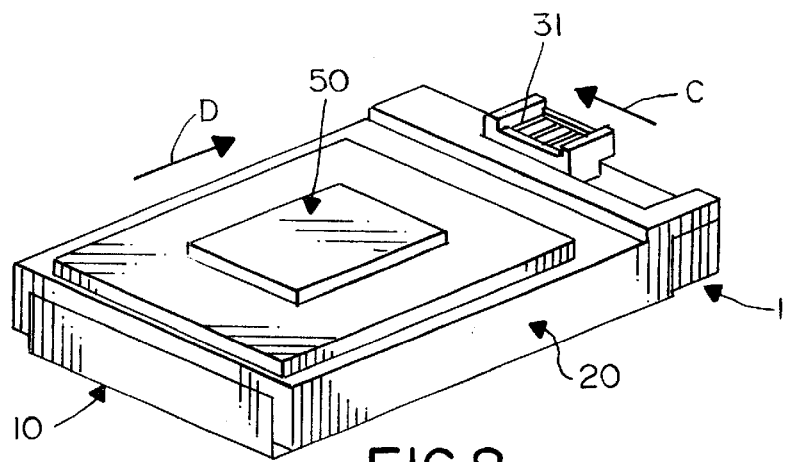
FIG. 8 is a view similar to that of FIG. 7, but with the socket in its engagement position.

FIGS. 6–8 show a PGA package 50, such as a semiconductor package or the like, having a plurality of lead pins 51 depending therefrom in a grid array. The number of lead pins and corresponding number of through holes 23 in slide plate 20 of socket 1 do not correspond to the depiction of FIG. 1 or subsequent FIGS. 9, 11 and 13, whereby FIG. 6 is somewhat schematic. PGA package 50 is positioned onto the top of slide plate 20 in the direction of arrow "E" (FIG. 6). Lead pins 51 enter through holes 23 with zero insertion forces, until PGA package 50 rests on top of slide plate 20 as seen in FIG. 7. In this open position, slide actuator 30 is in its open position. FIG. 8 shows the slide actuator having been moved in the direction of arrow "C" corresponding to the position shown in FIG. 3. As will be described hereinafter, this sliding movement of the slide actuator causes slide plate 20 to move in the direction of arrow "D."

Figure 10:
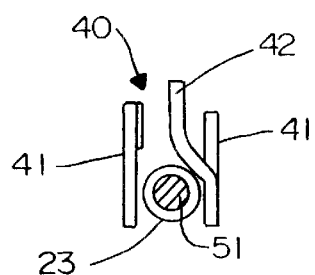
FIG. 10 is a top plan view of one of the terminals and pins when the socket is in its open position.

FIG. 10 shows one of the lead pins 51 from PGA package 50 (FIG. 6) inserted through one of the through holes 23 in slide plate 20. The lead pin is positioned within one of a plurality of terminals, generally designated 40, which are mounted within terminalreceiving passages 15 (FIG. 1) in base housing 10. As seen in FIG. 10, each terminal 40 includes a pair of side guide portions 41 and a contact portion 42 which angles inwardly from one of the guide portions. Lead pin 51 is inserted between the side guide portions with insertion force. As will be seen below, the lead pin is driven into engagement with contact portion 42 when slide plate 20 is driven by slide actuator 30.

In particular, reference is made to the sequential drawings 9–14 which illustrate the mode of operation of the socket. It should be understood that while FIGS. 10, 12 and 14 show one of the lead pins 51 inserted into one of the terminals 40, PGA package 50 has been removed from FIGS. 9, 11 and 13 to facilitate the illustration.

Figure 9:
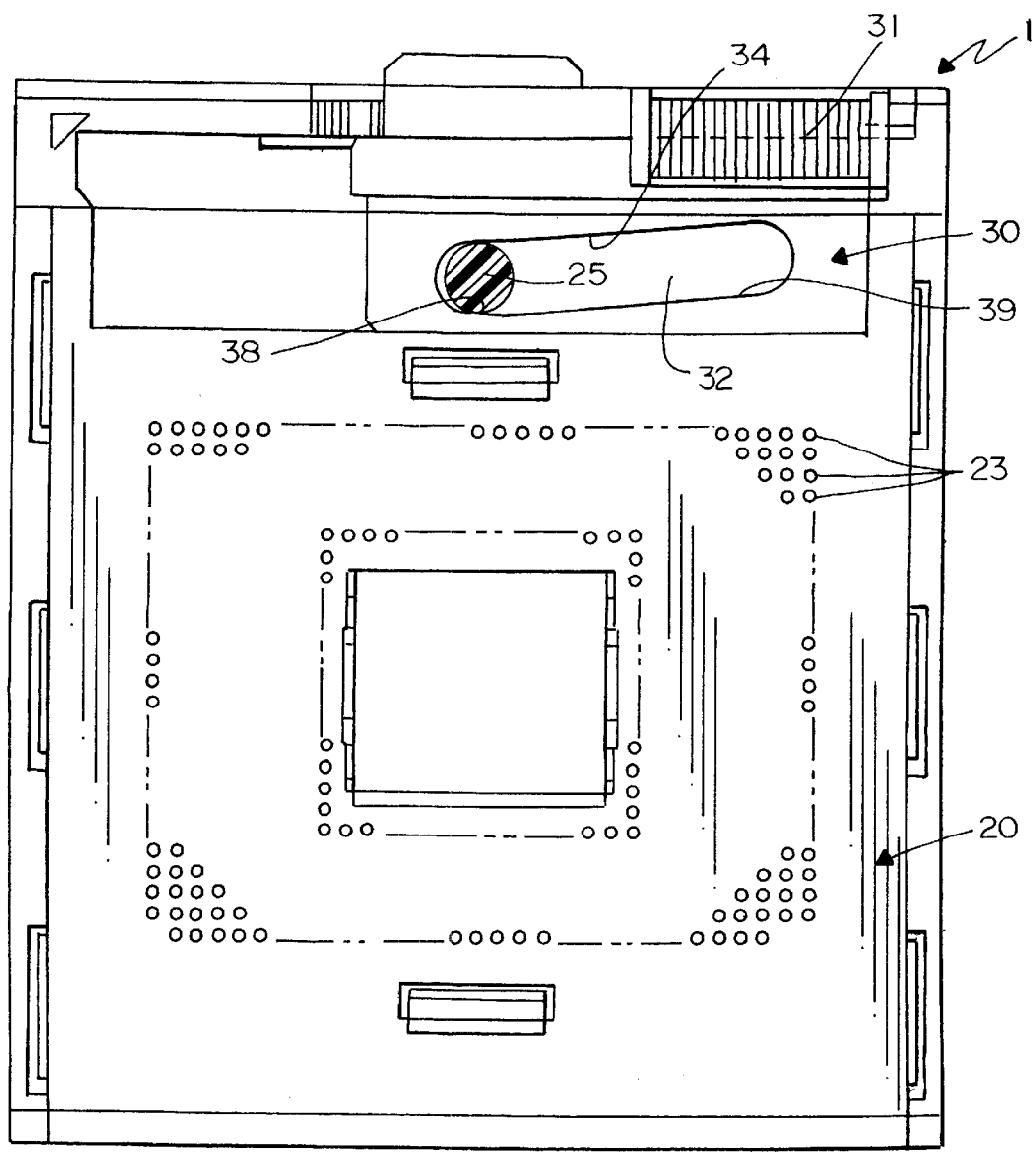
FIG. 9 is an enlarged top plan view of the socket in its open position.

With that understanding, FIG. 9 shows the condition of socket 1 in its open position with FIG. 10 showing lead pin 51 inserted freely into terminal 40. It can be seen in FIG. 9 that cam follower pin 25 is located at one end of cam slot 32 at the flat land area 38 thereof. Slide plate 20 and slide actuator 30 are in their respective open positions.

Figure 11:
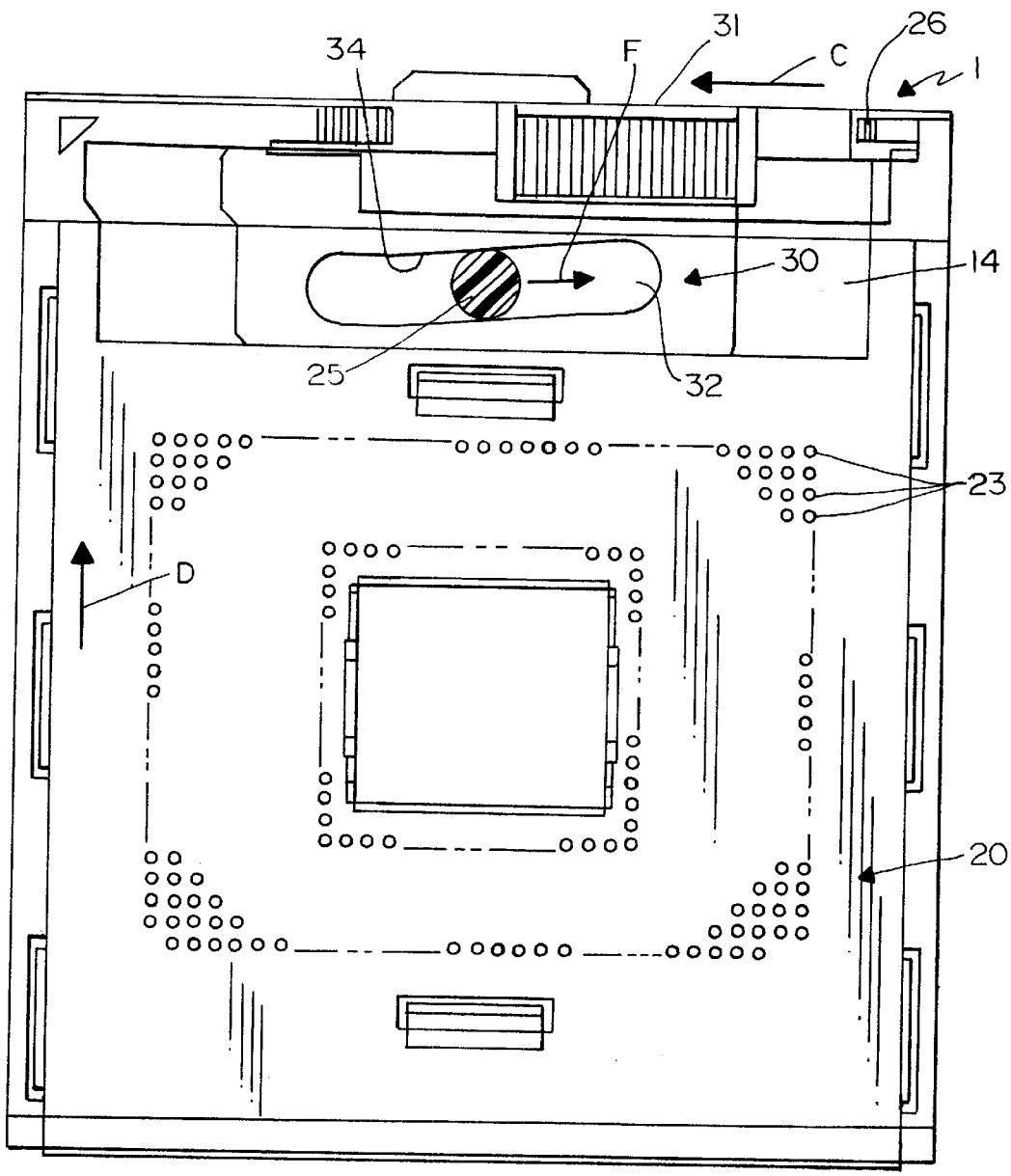
FIG. 11 is a view similar to that of FIG. 9, with the socket in a condition when the slide actuator is intermediate its open and engagement positions.
Figure 12:
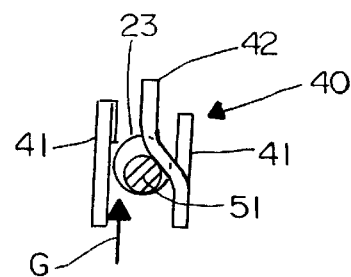
FIG. 12 is a view similar to that of FIG. 10, showing the condition of the terminals corresponding to the position of the socket in FIG. 11.

FIG. 11 shows slide actuator 30 having been moved partially in the direction of arrow "C" which is effective to drive cam following pin 25 partially along oblique portion 34 of cam slot 32. This drives slide plate 20 partially in the direction of arrow "D". As seen in FIG. 12, lead pin 51 has been driven in the direction of arrow "G" by its engagement within through hole 23 of the sliding plate 20. Consequently, lead pin 51 is driven into engagement with angled contact portion 42 of terminal 40.

Figure 13:
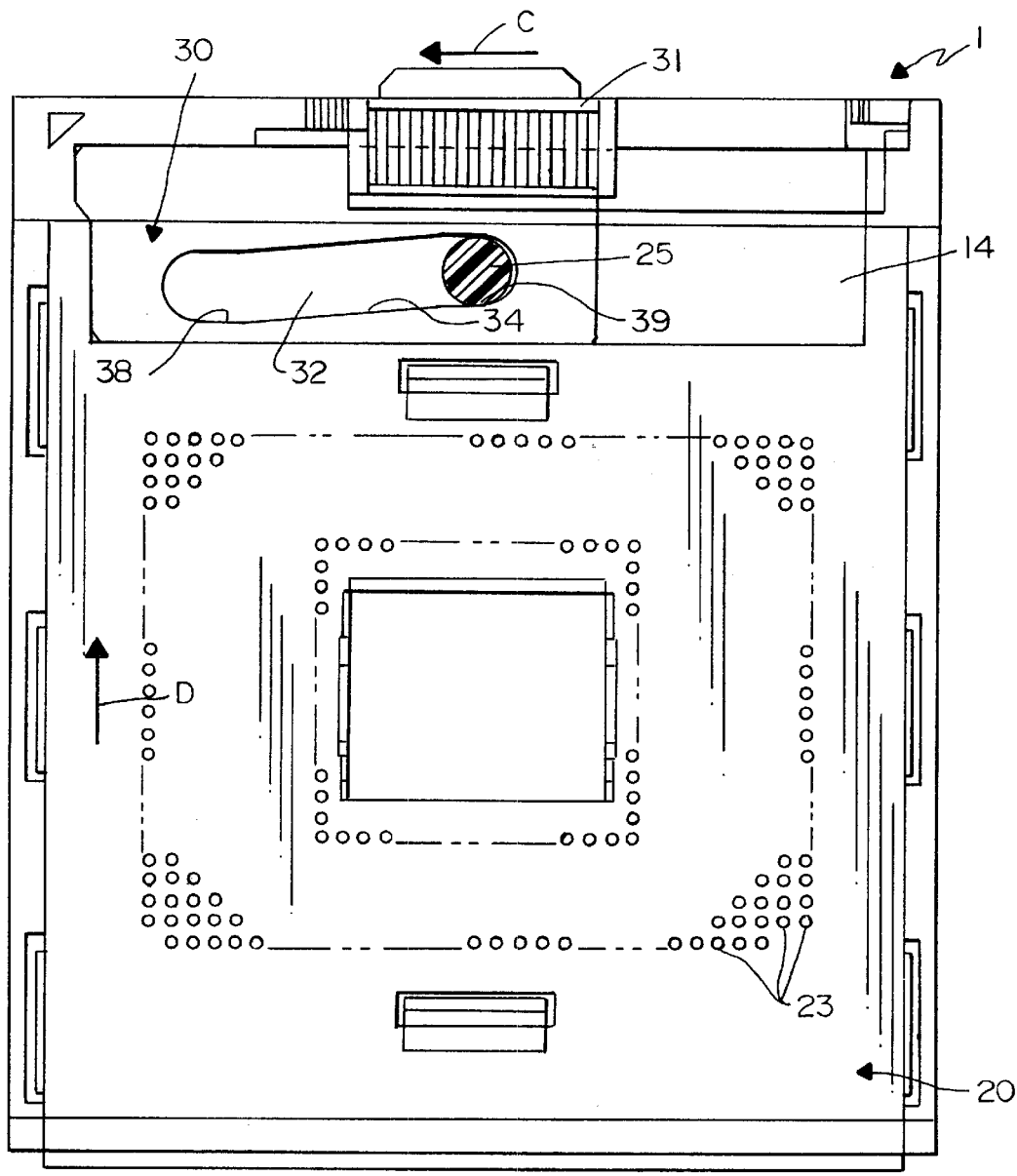
FIG. 13 is a view similar to that of FIGS. 9 and 11, but with the socket in its engagement position.
Figure 14:
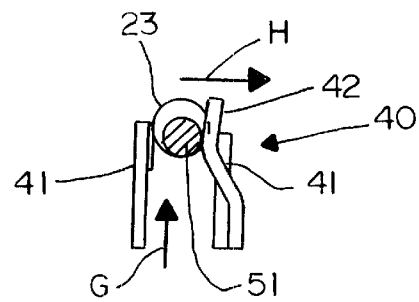
FIG. 14 is a view similar to that of FIGS. 10 and 12, but showing the condition of the terminal and pin when the socket is in its engagement position.

FIG. 13 shows slide actuator 30 having been moved completely in the direction of arrow "C" to its closed or engagement position whereat slide plate 20 has been driven completely in the direction of arrow "D" to its engagement position. Cam follower pin 25 now has been driven to the opposite end of cam slot 32 and rests at land area 39 of the slot. Correspondingly, FIG. 14 shows that lead pin 51 now has been driven in the direction of arrow "G" completely to its fully terminated position whereat the lead pin engages contact portion 42 and biases the contact portion laterally in the direction of arrow "H". The PGA package now is completely terminated to socket 1.

In order to remove the PGA package from the socket, slide actuator 30 simply is moved back opposite the direction of arrow "C" in FIGS. 13 and 11 until the slide actuator reaches its open position of FIG. 9. This sliding movement of the slide actuator causes slide plate 20 to move back opposite the direction of arrows "D" and moves lead pins 51 back out of engagement with contact portions 42 of terminals 40.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A socket for a pin grid array (PGA) package having a plurality of lead pins in a grid array, comprising:

a base housing;

a plurality of terminals mounted on the base housing in a grid array corresponding to the array of the lead pins of the PGA package;

a slide plate mounted on the base housing and including a plurality of through-holes arranged in a grid array for receiving therethrough the lead pins of the PGA package, the slide plate being slidably movable relative to the base housing in a given direction to drive the lead pins of the PGA package into engagement with the terminals on the base housing;

a slide actuator mounted on the base housing for essentially nonrotational sliding movement relative thereto in a direction generally transversely of said given direction of sliding movement of the slide plate; and complementary interengaging cam means between the slide plate and the slide actuator for slidably moving the slide plate relative to the base housing in response to sliding movement of the actuator relative to the housing.

2. The socket of claim 1 wherein said complementary interengaging cam means include a cam slot on one of the slide plate and slide actuator for receiving a cam follower positioned on the other of the slide plate and slide actuator, the cam slot extending obliquely to said given direction of sliding movement of the slide plate.

3. The socket of claim 2 wherein said cam slot is on the slide actuator and said cam follower comprises a pin on the slide plate inserted into the cam slot.

4. The socket of claim 2 wherein said cam slot includes a land area at least at one end thereof and extending generally perpendicular to said given direction.

5. The socket of claim 4, including one of said land areas at both opposite ends of the cam slot.

6. The socket of claim 1 wherein said slide actuator is movable relative to the base housing between an open position allowing free insertion of the lead pins of the PGA package into the through-holes in the slide plate and an engagement position driving the lead pins into engagement with the terminals, and including interengaging detent structure between the slide actuator and the slide plate to hold the actuator in at least one of said open and closed positions.

7. The socket of claim 6, further including detent structure for holding the actuator in both said open and closed positions.

8. The socket of claim 6 wherein said detent structure includes detent projections of said slide actuator and said slide plate and one of said detent projections is flexible.

9. The socket of claim 1 wherein said slide actuator includes an actuating structure projecting therefrom and extending along a recess in said slide plate.

10. The socket of claim 2 wherein said slide actuator includes an actuating structure projecting therefrom and extending along a recess in said slide plate.

11. The system of claim 10, the means for adjusting saturation further comprising:

means for adding, for each identified pixel, an adjustment value to a saturation value of the identified pixel if the source color is less saturated than the destination color.

12. The system of claim 10, the means for adjusting saturation further comprising:

means for multiplying, for each identified pixel, a saturation valve of the identified pixel by an adjustment value if the source color is more saturated than the destination color.

13. The socket of claim 11, including one of said land areas at both opposite ends of the cam slot.

14. The socket of claim 11, including detent means for holding the actuator in both said open and closed positions.

15. The socket of claim 11 wherein said slide actuator includes an actuating structure projecting therefrom and extending along a recess in said slide plate.

* * * * *